(12) United States Patent
Kim et al.

(10) Patent No.: US 12,451,268 B2
(45) Date of Patent: Oct. 21, 2025

(54) ELECTRIC CONTACT TERMINAL

(71) Applicant: JOINSET CO., LTD., Ansan-si (KR)

(72) Inventors: Sun-Ki Kim, Gunpo-si (KR);
Gang-Yeol Lee, Ansan-si (KR);
Byung-Joo Park, Ansan-si (KR);
Hyoung-Kyu Kim, Ansan-si (KR)

(73) Assignee: JOINSET CO., LTD. (KR)

( * ) Notice: Subject to any disclaimer, the term of this patent is extended or adjusted under 35 U.S.C. 154(b) by 67 days.

(21) Appl. No.: 18/213,453

(22) Filed: Jun. 23, 2023

(65) Prior Publication Data

US 2023/0420157 A1    Dec. 28, 2023

(30) Foreign Application Priority Data

Jun. 24, 2022   (KR) .................. 10-2022-0077865
Aug. 25, 2022   (KR) .................. 10-2022-0107076

(51) Int. Cl.

| | |
|---|---|
| *H01R 4/22* | (2006.01) |
| *H01B 5/14* | (2006.01) |
| *H01R 4/02* | (2006.01) |
| *H01R 4/04* | (2006.01) |
| *H01R 12/57* | (2011.01) |

(52) U.S. Cl.
CPC ............. *H01B 5/14* (2013.01); *H01R 4/02* (2013.01); *H01R 4/029* (2013.01); *H01R 4/04* (2013.01); *H01R 12/57* (2013.01)

(58) Field of Classification Search
CPC ........................................ H01R 4/22
USPC ........................................ 174/74 R, 74 A, 78
See application file for complete search history.

(56) References Cited

U.S. PATENT DOCUMENTS

| | | | | |
|---|---|---|---|---|
| 8,964,408 | B2* | 2/2015 | Lee ............. | H05K 9/002 |
| | | | | 720/650 |
| 2006/0151962 | A1* | 7/2006 | Hammaker ...... | F16J 15/104 |
| | | | | 277/653 |
| 2009/0209121 | A1* | 8/2009 | Kim ............. | H05K 3/4015 |
| | | | | 439/83 |
| 2011/0266031 | A1* | 11/2011 | Kim ............. | H01R 13/2414 |
| | | | | 174/126.2 |
| 2023/0093996 | A1* | 3/2023 | Chen ............ | H05K 9/0015 |
| | | | | 174/261 |

FOREIGN PATENT DOCUMENTS

| | | | |
|---|---|---|---|
| CN | 112993606 | * | 6/2021 |
| KR | 100993253 B1 | | 11/2010 |

* cited by examiner

*Primary Examiner* — Chau N Nguyen
(74) *Attorney, Agent, or Firm* — Park & Associates IP Law Office

(57) ABSTRACT

Disclosed is an elastic electric contact terminal capable of implementing various electrical pathways. The electric contact terminal includes: an elastic core; a polymer film surrounding the core in a width direction thereof; and a conductive laminate in which a metal foil is laminated on an outer surface of the polymer film. The polymer film is bonded to top and bottom surfaces of the core with an adhesive layer therebetween, and one end of the conductive laminate extends lengthily to the outside of the core to form a terminal part.

7 Claims, 3 Drawing Sheets

ELECTRIC CONTACT TERMINAL

REFERENCE TO RELATED APPLICATIONS

This application claims the priority benefit of Korean Patent Application No. 10-2022-0077865 filed on Jun. 24, 2022 and Korean Patent Application No. 10-2022-0107076 filed on Aug. 25, 2022, the entire contents of which are incorporated herein by reference.

FIELD OF THE INVENTION

The present disclosure relates to an electric contact terminal, and more particularly, to an electric contact terminal capable of implementing an electric passage in various methods.

BACKGROUND OF THE INVENTION

An electric contact terminal is used to electrically connect electric conductive objects or conductive patterns of a printed circuit board in a state in which the electric conductive objects or the conductive patterns of the printed circuit board are individually or mutually disposed opposite to each other.

For example, Korean Patent Registration No. 10-0993253 that is filed and registered by the present applicant discloses an elastic electric terminal including a foamed elastic core having a sheet shape; a non-foamed rubber coating layer bonded to top and bottom surfaces of the foamed elastic core along one side surface; and a heat-resistant polymer film having one surface bonded to the non-foamed rubber coating layer to surround the non-foamed rubber coating layer and the other surface integrally formed with a metal layer, in which the foamed elastic core is exposed to the outside at the other side surface opposite to the one side surface.

According to the above patent, since the polymer film does not cover one side surface of the core, the electric contact terminal may be easily manufactured with a small size, may have excellent elasticity and elastic recovery rate after manufacturing and require less pressing force, and may not have a lead rising phenomenon at a side surface that is not covered when soldering is performed.

Here, a polymer film in a heat-resistant polymer film in which a metal layer is integrally formed typically provides mechanical strength and electrical insulation.

However, since the electric contact terminal forms an electrical pathway between objects disposed opposite to each other in a vertical direction only, the electric contact terminal hardly provides an electrical pathway between objects disposed at different angles, e.g., 90°.

In this case, although the objects may be electrically connected by adjusting a mounting position of the electric contact terminal, a reliable electrical connection with another object is hardly obtained in a state in which metal layers are formed in the vertical direction, and the electric contact terminal is mounted to one object by soldering.

Also, since the electric contact terminal is mounted on a circuit board by soldering by surface mounting, the electric contact terminal is difficult to be mounted and fixed to an instrument such as a metal case that is hardly soldered.

Also, since a polymer film integrally formed with a metal layer is typically electrically insulating, an electrical connection is not performed even when an electrically conductive object contacts a portion covered by the polymer film.

Also, when a core of the electric contact terminal is made of a foam having relatively low mechanical strength, a sidewall of the core exposed to the outside may be opened by external force because the sidewall is not covered by the polymer film.

SUMMARY OF THE INVENTION

The present invention provides an elastic electric contact terminal capable of implementing various electrical pathways.

The present invention also provides an electric contact terminal that is easily fixed to an object disposed opposite thereto and electrically contacts the object in various methods.

The present invention also provides an electric contact terminal that is easily deformed according to arrangement forms of an object disposed opposite thereto.

The present invention also provides an electric contact terminal in which one surface or both surfaces conduct electricity smoothly and which has excellent environmental resistance.

The present invention also provides an electric contact terminal in which a metal foil is less wrinkled or deformed when pressed by external force.

The present invention also provides an electric contact terminal in which a sidewall of a core exposed to the outside is not easily opened by external force.

An embodiment of the present invention provides an electric contact terminal including: a core; a metal foil bonded to top and bottom surfaces of the core with an elastic adhesive therebetween to surround at least one side surface in a width direction of the core. Here, a corrosion preventing layer is formed on one surface of the metal foil, one end of the metal foil extends to the outside of the core in a longitudinal direction of surrounding the core to form a terminal part, in the terminal part, the one surface is an exposed surface, and the other surface is a contact surface electrically connected to an object, and the exposed surface of the terminal part is prevented from being corroded by the corrosion preventing layer.

In an embodiment, the corrosion preventing layer may be a metal coating layer or a polymer layer.

In an embodiment, the core may be an elastic non-foamed body having an inner through-hole formed along a longitudinal direction thereof and a curved side surface, and one side surface and the other side surface of the core may be surrounded and bonded by the metal foil.

In an embodiment, the core may be a non-foamed body having a rectangular cross-sectional shape in which a side surface forms a plane, an empty space may be formed between one side surface of the core and the metal foil, the other surface of the core may not be surrounded by the metal foil, the core may be an elastic body, and a polymer support may be bonded to the top surface of the core.

In an embodiment, the core may be an elastic foamed body including a plurality of pores and having a rectangular cross-sectional shape in which a side surface forms a plane, a polymer support may be bonded to the top surface of the core, an empty space may be formed between one side surface of the core and the metal foil, and the other surface of the core may not be surrounded by the metal foil.

In an embodiment, both the core and the polymer support may be surrounded and bonded by a polymer cover.

In an embodiment, an adhesive layer may be integrally formed by extending the adhesive in the longitudinal direction from a boundary between the core and the terminal part to improve elasticity of the terminal part.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE INVENTION

In the following description, the technical terms are used only for explain a specific exemplary embodiment while not limiting the present invention. Unless otherwise defined, all terms (including technical and scientific terms) used herein have the same meaning as generally understood by those skilled in the art. In addition, when the technical terms used in the present invention do not accurately express the spirit of the present invention, they should be replaced with technical terms that are understood by those skilled in the art. Terms as defined in a commonly used dictionary should be construed as having the same meaning as in an associated technical context, and unless defined apparently in the description, the terms are not ideally or excessively construed as having formal meaning.

Hereinafter, embodiments of the present disclosure will be described in detail with reference to the accompanying drawings.

In the following description, 'bonding' and 'adhesion' are used interchangeably unless otherwise specified.

Figure 1:
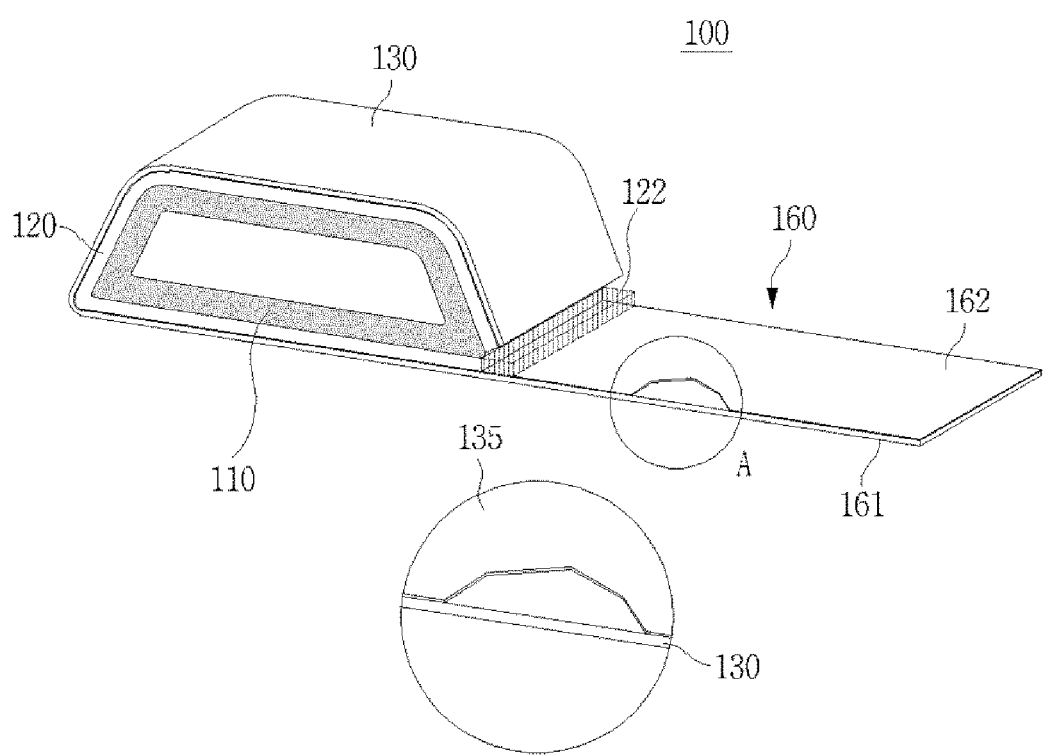
FIG. 1 is a view illustrating an electric contact terminal according to an embodiment of the present invention.
Figure 2:
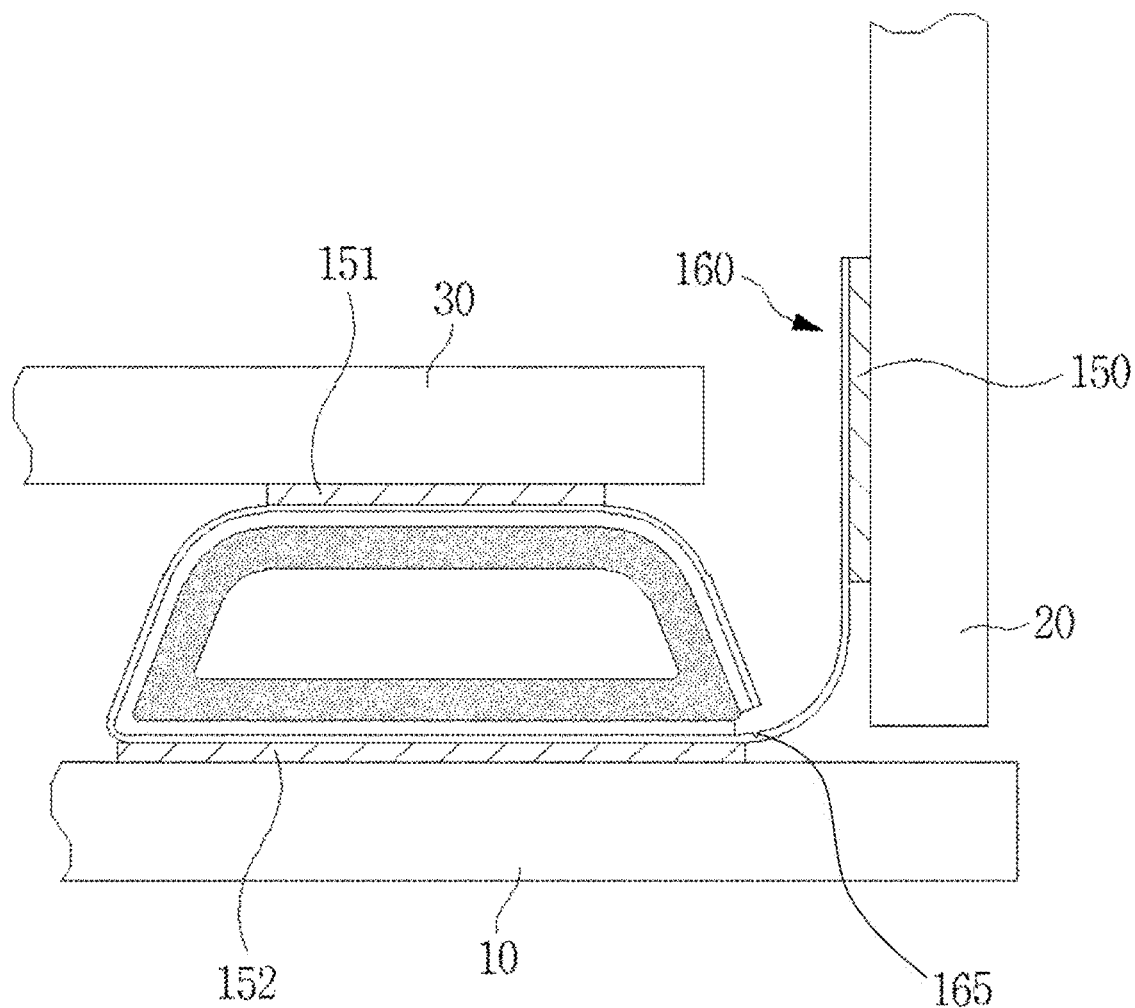
FIG. 2 is a view illustrating an application example of the electric contact terminal.

FIG. 1 is a view illustrating an electric contact terminal according to an embodiment of the present disclosure, and FIG. 2 is a view illustrating an application example of the electric contact terminal.

An electric contact terminal 100 includes a core 110 and a metal foil 130 bonded to top and bottom surfaces of the core 110 with an adhesive 120 therebetween to surround at least one side surface of a width direction of the core 110. A metal coating layer 135 is formed on one surface of the metal foil 130, and one end of the metal foil 130 extends to the outside of the core 110 in a longitudinal direction in which the metal foil 130 surrounds the core 110 to form a terminal part 160.

Preferably, the core 110 has a width greater than a height of the core 110 so that the core 110 has stability.

Preferably, a plating layer or deposition layer made of tin, nickel, or gold may be formed on the other surface of the metal foil 130.

The terminal part 160 includes a contact surface 161 formed by the metal foil 130 and electrically connected to an object 20 and an exposed surface 162 caused by the metal coating layer 135 and exposed to the outside from an opposite side of the contact surface 161. Corrosion of the metal foil 130 is prevented by the metal coating layer 135 on the exposed surface 162 and electrical resistance of the exposed surface 162 is extremely low.

As illustrated in FIG. 2, the terminal part 160 is bent upward. Alternatively, the terminal part 160 may be bent downward. Preferably, the contact surface 161 is electrically connected to an electrically conductive object.

Selectively, the metal coating layer 135 may be formed on both the contact surface 161 and the exposed surface 162 to prevent the metal foil 130 from being corroded.

The metal coating layer 135 may be a metal plating layer or a metal deposition layer formed by plating or depositing nickel, silver, gold, or tin on the metal foil 130.

Although the metal foil 130 surrounds only one side surface in this embodiment, the metal foil 130 may surround a portion or a whole of the other side surface disposed at an opposite side.

The metal foil 130 has a width corresponding to a length of the core 110, and preferably, the width of the metal foil 130 is equal to the length of the core 110.

An adhesive 120 is continuously bonded to the metal foil 130 disposed at a portion in which the metal foil 130 surrounds one side surface of the core 110 to improve elasticity of the metal foil 130.

As illustrated in FIG. 2, the terminal part 160 may be freely bent to contact the object 20 and electrically connected by welding, soldering or an adhesive tape.

As the terminal part 160 has a length greater than a maximum height of the core 110, ultrasonic or laser welding may be easily performed, the terminal part 160 may easily correspond to the object although the object is spaced apart, and bonding strength with the object may increase.

Also, as an area of the terminal part 160 increases, a separate electrically conductive elastomer may be easily mounted.

Although at least a portion of the top and bottom surfaces of the core 110 may form a plane, the embodiment of the present invention is not limited thereto.

Although the core 110 may be made of non-foamed rubber having elasticity to be easily manufactured such as a silicone rubber material, the embodiment of the present invention is not limited thereto.

In this embodiment, the core 110 is a non-foamed body having a tube structure that is formed by extrusion and has an inner through-hole, and both sides of the core 110 are surrounded and bonded by the metal foil 130, the other side surface of the core 110 is not surrounded by the metal foil 130, or an empty space is formed between the metal foil 130 and the other side surface of the core 110.

When the core 110 has a height of 0.8 mm or less, the inner through-hole of the core 110 may not be formed.

Elasticity and an elastic recovery rate of the electric contact terminal may be improved by forming the space between the metal foil 130 and the core 110, and a RF performance may be improved by minimizing wrinkles of the metal foil 130 in the space.

A polymer support (not shown) may be bonded to at least the top surface of the core 110, and this structure allows the metal foil 130 to be less wrinkled or deformed by the polymer support laminated on the top surface of the core 110 when a top surface of the electric contact terminal is pressed by external force.

As will be described later, the core 110 may be a foam having a plurality of pores. In this case, an empty space may be formed between one side surface of the core 110 and the metal foil 130, and the other side surface may not be surrounded by the metal foil 130.

The adhesive 120 may be silicone rubber having heat resistance and elasticity and provide reliable bonding between the core 110 and the metal foil 130.

The adhesive 120, e.g., liquid silicone rubber, is cured between the core 110 and the metal foil 130 to bond the core 110 and the metal foil 130 to each other.

As described above, since the adhesive 120 is made of silicone rubber having elasticity, the adhesive 120 may easily provide a space at a portion surrounding a sidewall of the core 110, may not be easily folded in the space, and may have restoration force when pressed.

As illustrated by dot line and hatching in FIG. 1, an adhesive layer 122 may be integrally formed by extending the adhesive 120 in the longitudinal direction from the boundary between the core 110 and the terminal part 160. According to this structure, when the terminal part 160 is bent, the adhesive layer 122 supports the terminal part 160, thereby improving elasticity of the terminal part 160.

Also, a notch 165 (see FIG. 2) may be formed at the boundary between the core 110 and the terminal part 160 along the width direction of the terminal part 160 so that the terminal part 160 is easily bent.

Although the metal foil 130 may be made of a copper foil or an aluminum foil to have excellent flexibility, the embodiment of the present invention is not limited thereto. More preferably, the metal foil 130 may be made of a material corresponding to soldering, ultrasonic or laser welding.

Although not particularly limited, when the terminal part 160 is welded to the object by an ultrasonic wave or a laser, the metal foil 130 of the terminal part 160 may have a thickness of about 5 μm to about 100 μm because the metal foil 130 is required to have a predetermined thickness or more.

Here, the metal foil 130 on which the polymer layer is formed may have a thickness less than that of the metal foil 130 on which the polymer layer is not formed.

As described above, the terminal part 160 that is a portion mounted to the object disposed opposite thereto and electrically contacting the object is required to have a predetermined thickness or more and excellent corrosion resistance, so that the terminal part 160 is bent to be welded or soldered in a direction toward the object.

Selectively, an adhesive 150 for bonding with the object 20 disposed opposite thereto may be further provided to the contact surface 161 of the terminal part 160. The adhesive 150 may be, e.g., a double-sided adhesive tape and serve to temporarily bond the terminal part 160 to the object before ultrasonic or laser welding is performed.

Preferably, the adhesive 150 may be is an acrylic or silicone-based resin, and may have a thickness of about 5 μm to about 50 μm.

Also, selectively, adhesive tapes 151 and 152 may be bonded to top and bottom surfaces of the metal foil 130 so that the electric contact terminal 100 is bonded to the objects 10 and 30 disposed opposite thereto.

Although the adhesive tapes 151 and 152 may electrically connect the electric contact terminal 100 to the object disposed opposite thereto with electrical conductivity, the embodiment of the present invention is not limited thereto.

Referring to FIG. 2, it is assumed that the electrically conductive objects 10 and 30 are disposed in a vertical direction and the electrically conductive object 20 is disposed at one side.

First, the terminal part 160 of the metal foil 130 of the electric contact terminal 100 is electrically connected to the object 20, e.g., a metal case, by bonding with the adhesive tape 150 or by completely fixing through ultrasonic or laser welding to improve reliability.

Thereafter, the bottom surface of the metal foil 130 corresponding to the core 110 of the electrical contact terminal 100 is fixed to the object 10, e.g., a circuit board, by various methods such as soldering or an adhesive. FIG. 2 shows bonding by using the adhesive tape 152.

Thereafter, when the top surface of the metal foil 130 is bonded and electrically connected to the object 30 with the adhesive tape 151 therebetween, the electrical connection may be implemented by soldering or direct contact as described above.

Through this connection structure, the objects 10, 20, and 30 may be electrically connected to each other with the electric contact terminal 100 therebetween.

In other words, various electrical pathways including the object to the object 20, the object 10 to the object 30, and the object 20 to the object 30 connected by one electric contact terminal 100 may be provided.

As described above, the metal foil 130 may be electrically connected to the objects 10, 20, and 30 in various forms including direct contact, soldering, or the adhesive tape.

It should be noted that at least one adhesive tape is required to be bonded to an outer surface of the metal foil 130 because a plurality of electric contact terminals 100 are arranged on a release film on a separately provided sheet.

FIGS. 3A to 3D each illustrate an electric contact terminal according to another embodiment of the present invention.

Figure 3A:
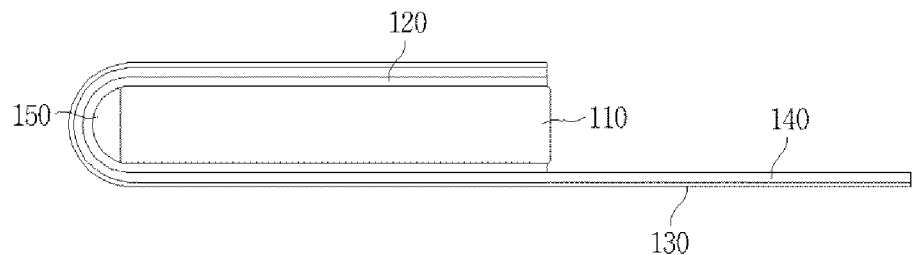
FIGS. 3A to 3D are views each illustrating an electric contact terminal according to another embodiment of the present invention.

Referring to FIG. 3A, an electric contact terminal includes a core 110 and a metal foil 130 bonded to each of top and bottom surfaces of the core 110 to surround at least one side surface in a width direction of the core 110, and a polymer layer 140 is formed on one surface of the metal foil 130.

Selectively, a plating layer or deposition layer made of tin, nickel, or gold may be formed on the other surface of the metal foil 130.

One end, which surrounds the core 110, in a longitudinal direction of the metal foil 130 extends to the outside of the core 110 to form a terminal part 160, the terminal part 160 includes a contact surface 161 electrically connected to an object by the metal foil 130 and an exposed surface 162 exposed to the outside by a polymer layer 140, and the exposed surface 162 of the terminal part is covered by the polymer layer 140 to prevent corrosion of the metal foil 130.

The polymer layer 140 may be a polymer film bonded to the metal foil 130 or a polymer coating layer obtained by coating the metal foil 130 with a polymer resin.

Preferably, the polymer layer 140 may be electrically insulating.

Although the polymer layer 140 may have heat resistance corresponding to soldering and be made of, e.g., polyimide (PI) having excellent heat resistance, the embodiment of the present invention is not limited thereto.

As the terminal part 160 includes the metal foil 130 having the polymer layer 140 formed on one surface thereof, the terminal part 160 may easily implement an electrically insulating property because one surface of the terminal part 160 is the polymer layer 140, and also have excellent environmental resistance and improve mechanical strength thereof.

In this embodiment, the core 110 that is a non-foamed body having a sheet-shape with a relatively small thickness may or may not have elasticity, and the core 110 may have one side surrounded by the metal foil 130 while an empty space 150 is formed and the other surface that is not surrounded by the metal foil 130.

Here, the core 110 may be non-foamed silicone rubber with excellent elasticity or a polymer film with little elasticity, and when the core 110 is made of silicone rubber, a polymer support 111 (not shown) may be bonded onto a top surface of the core 110 so that wrinkles or deformation of the metal foil 130 caused by external force decreases.

An elastic recovery rate of the electric contact terminal may be improved by forming the space between the metal foil 130 and the core 110, and a RF performance may be improved by minimizing the wrinkles of the metal foil 130 in the space.

Also, since the core 110 has a sheet shape having a relatively small thickness, as the metal foil 130 is not bonded to or does not surround the other side surface of the core 110, the elastic recovery rate may be improved, and material costs may be reduced.

Figure 3B:
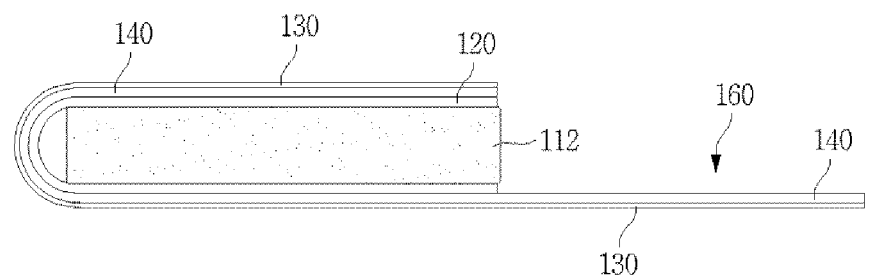

Referring to FIG. 3B, an electrical contact terminal includes a foam core 112 having elasticity and a metal foil 130 bonded to top and bottom surfaces of the core 112 with an adhesive 120 having elasticity therebetween to surround one side surface in a width direction of the core 112. In this embodiment, a polymer layer 140 is formed on one surface of the metal foil 130, i.e., a surface opposite to the core 112, and one end of the metal foil 130 extends to the outside of the core 112 along a longitudinal direction of surrounding the core 112 to form a terminal part 160.

The core 112 may be made of foamed silicone rubber having heat resistance corresponding to soldering or foamed urethane rubber having heat resistance less than that of the foamed silicone rubber.

Figure 3C:
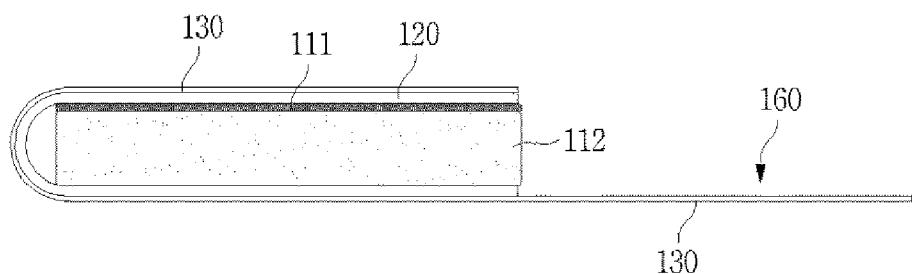

Referring to FIG. 3C, an electrical contact terminal includes a foam core 112 having elasticity and a metal foil 130 bonded to top and bottom surfaces of the core 112 with an adhesive 120 having elasticity therebetween to surround at least one side surface in a width direction of the core 112.

As with an embodiment of FIG. 1, a metal coating layer 135 including a metal plating layer or a metal deposition layer formed by plating or depositing nickel, silver, gold, or tin is formed on one surface of the metal foil 130, and one end of the metal foil 130 in a longitudinal direction of surrounding the core 112 extends to the outside of the core 112 to form a terminal part 160.

Selectively, a plating layer or deposition layer made of tin, nickel, or gold may be formed on the other surface of the metal foil 130.

The core 112 may be made of foamed silicone rubber having heat resistance corresponding to soldering or foamed urethane rubber having heat resistance less than that of the foamed silicone rubber.

Preferably, the core 112 may have a rectangular cross-section. In other words, since the core 112 is manufactured by cutting a sheet in the form of a roll having a great width and a great length into a sheet having a predetermined width, both cut side surfaces and top and bottom surfaces form a rectangular cross-section. However, the embodiment of the present invention is not limited thereto.

In this embodiment, a polymer support 111 may be bonded to at least the top surface of the core 112 to provide mechanical strength to the core 112, thereby minimizing a damage of the metal foil 130 caused by external force.

For example, since the core 112 is a foamed product having weak mechanical strength, when a portion of a top surface of the electrical contact terminal is pressed, the portion is pressed significantly, so that the metal foil 130 is easily wrinkled or deformed at the portion. Thus, the polymer support 111 having great mechanical strength may reduce the damage of the metal foil 130 caused by external force.

Preferably, the polymer support 111 may be a polyester film or a polyimide film. The polymer support 111 may be integrally bonded to the core 112 when manufacturing the core 112 or bonded to the core 112 by using a separate adhesive.

When the support 111 is installed on each of the top and bottom surfaces of the core 112, the support 111 disposed on the top surface may have a thickness greater than that of the support 111 disposed on the bottom surface, so that the metal foil 130 is not easily wrinkled when the metal foil 130 is pressed from above.

For example, the support 111 disposed on the top surface may have a thickness of about 50 µm to about 100 µm.

In this embodiment, since a polymer layer 140 is not formed on the metal foil 130 of the electrical contact terminal, both side surfaces of the terminal part 160 conduct electricity smoothly, corrosion is prevented by the metal coating layer 135 of the terminal part 160, and the polymer support 111 allows the metal foil 130 to be less wrinkled or damaged by external force.

Figure 3D:
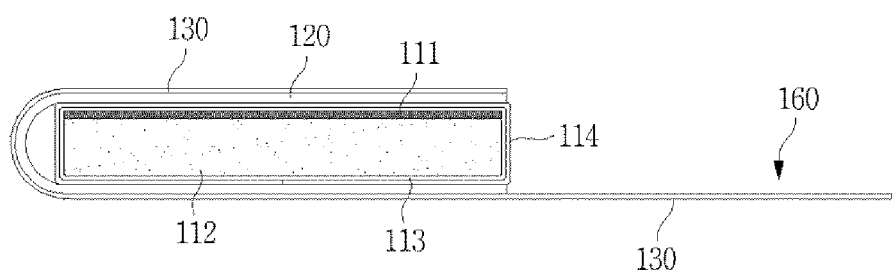

Referring to FIG. 3D, a cover 114 is bonded while surrounding an outer surface including a core 112 and a support 111 with an adhesive 113 therebetween from the embodiment of FIG. 3C.

As with this embodiment, although the core 112 that is a foam has both exposed side surfaces including a plurality of pores, the cover 114 covers the pores to prevent the side surface of the core 112 from being easily opened or lifted by external force applied from the side.

Particularly, although the side surfaces of the core 112 is easily opened by external force as hardness decreases due to a great foam rate of the core 112 or a thickness of the core 112 increases, the cover 114 may compensate this limitation.

An adhesive 113 bonding the core 112 and the cover 114 may include a thermoplastic adhesive such as a hot melt or a double-sided adhesive, and an adhesive 120 bonding the cover 114 and the metal foil 130 may include a silicone rubber adhesive having elasticity.

Here, the cover 114 may include a polymer film or a woven fabric or non-woven fabric. The cover may have a thickness of 5 µm to 30 µm.

The core 112 is bonded to the cover 114 such that top and bottom surfaces of the core 112 are surrounded by the cover 114 of the polymer film on which a hot melt 113 is bonded and heated.

The above-described electrical contact terminal according to the present invention is provided in such a manner that the adhesives bonded to the outer surface of the electric contact terminal are arranged on the release film for easy usage of a customer.

As described above, the electric contact terminal according to the present invention easily provides a reliable electrical connection by bonding a plurality of objects disposed opposite to each other in various directions and includes the terminal part 160 having excellent environmental resistance.

According to the above-described structure, the electrical pathways may be implemented in various methods by using one electric contact terminal.

Also, one electric contact terminal may be fixed and mounted to the object in various methods.

Also, the electric contact terminal may easily provide the reliable electrical connection between objects according to the structures and shapes of the core and the laminate.

Also, when the elastic adhesive layer is formed on at least a portion of the terminal part of the metal foil, the terminal part may have elasticity.

Also, when the groove is formed in at least a portion of the terminal part of the metal foil, the terminal part may be easily deformed.

Also, as the polymer layer is formed on the terminal part of the metal foil, the metal foil may be prevented from being corroded and have the mechanical strength and one electrically insulating surface.

Also, as the metal plating layer or deposition layer is formed on the terminal part of the metal foil, the metal foil may be prevented from being corroded, and each of the both surfaces may have the low electrical resistance.

Also, since the terminal part has the length greater than the height of the core, the terminal part may be easily connected with another object such as the metal case by the adhesive, the ultrasonic wave, or the laser, and another elastic body may be easily mounted to the terminal part.

Also, as the polymer support having high mechanical strength is bonded to the top surface of the core having low mechanical strength, the metal foil is less wrinkled or deformed when the metal foil is pressed by external force.

Also, as the side surface of the core exposed to the outside is made of the non-foamed material or covered by the cover, the corresponding portion may not be easily opened by external force.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An electric contact terminal for implementing an electrical passage with conductive objects, the electrical contact terminal comprising:
    a tube-shaped elastic core formed of non-foamed material, wherein the elastic core has a generally polygonal outer appearance including upper, lower, left, and right surfaces;
    a metal foil including first and second faces opposite each other, wherein the metal foil has a metal coating layer, or a polymer layer, formed on the first face,
    wherein the metal foil is configured to surround at least the upper, left and lower surfaces of the elastic core, and is adhered to the elastic core with an elastic adhesive therebetween,
    wherein on the lower surface of the elastic core, the metal foil is further extended externally from the elastic core in a longitudinal direction of the elastic core to form a terminal part in the extended area,
    wherein in the terminal part, the first face on which the metal coating layer or the polymer layer is formed is an exposed surface, and the second face is configured as a contact surface for electrically connecting to an electrically conductive object, and
    wherein an adhesive tape is adhered to at least a portion of the second face of the metal foil,
    wherein an adhesive layer strip is formed by applying the adhesive in a width direction of the terminal part at a boundary between the elastic core and the terminal part to improve elasticity of the terminal part.

2. The electric contact terminal of claim 1, wherein the right surface of the elastic core is not surrounded by the metal foil.

3. An electric contact terminal for implementing an electrical passage with conductive objects, the electrical contact terminal comprising:
    a tube-shaped elastic core formed of non-foamed material, wherein the elastic core has a generally polygonal outer appearance including upper, lower, left, and right surfaces;
    a metal foil including first and second faces opposite each other, wherein the metal foil has a metal coating layer, or a polymer layer, formed on the first face,
    wherein the metal foil is configured to surround at least the upper, left and lower surfaces of the elastic core, and is adhered to the elastic core with an elastic adhesive therebetween,
    wherein on the lower surface of the elastic core, the metal foil is further extended externally from the elastic core in a longitudinal direction of the elastic core to form a terminal part in the extended area,
    wherein in the terminal part, the first face on which the metal coating layer or the polymer layer is formed is an exposed surface, and the second face is configured as a contact surface for electrically connecting to an electrically conductive object, and
    wherein an adhesive tape is adhered to at least a portion of the second face of the metal foil,
    wherein a notch is formed in a width direction of the terminal part at a boundary between the core and the terminal part to easily bend the terminal part.

4. An electric contact terminal for implementing an electrical passage with conductive objects, the electrical contact terminal comprising:
    an elastic core of foamed material, wherein the elastic core includes upper, lower, left, and right surfaces;
    a polymer cover surrounding and adhered to the upper, lower, left, and right surfaces of the elastic core with hot melt therebetween; and
    a metal foil including first and second faces opposite each other, wherein the metal foil has a polymer layer formed on the first face,
    wherein the metal foil is configured to surround the upper, left and lower surfaces of the polymer cover, and the polymer layer of the metal foil is adhered to upper and lower surfaces of the polymer cover with an elastic adhesive therebetween,
    wherein an empty space is formed between the left surface of the polymer cover and the metal foil, and the right surface of the polymer cover is not surrounded by the metal foil,
    wherein on the lower surface of the elastic core, the metal foil is further extended externally from the core in a longitudinal direction of the elastic core to form a terminal part in the extended area,
    wherein in the terminal part, the first face on which the polymer layer is formed is an exposed surface, and the second face is configured as a contact surface for electrically connecting to an electrically conductive object, and
    wherein an adhesive tape is adhered to at least a portion of the second face of the metal foil.

5. The electric contact terminal of claim 4, wherein a polymer support is adhered to at least one of the upper and lower surfaces of the elastic core, and
    both the elastic core and the polymer support are surrounded and adhered by the polymer cover with a hot melt therebetween.

6. The electric contact terminal of claim 4, wherein a notch is formed along a width direction of the terminal portion at a boundary between the elastic core and the terminal part to easily bend the terminal part.

7. An electric contact terminal for implementing an electrical passage with conductive objects, the electrical contact terminal comprising:
    an elastic core of foamed material, wherein the elastic core includes upper, lower, left, and right surfaces;

a polymer cover surrounding and adhered to the upper, lower, left, and right surfaces of the elastic core with hot melt therebetween; and a metal foil including first and second faces opposite each other, wherein the metal foil has a metal coating layer formed on the first face, wherein the metal foil is configured to surround at least the upper, left and lower surfaces of the polymer cover, and the metal coating layer of the metal foil is adhered to upper and lower surfaces of the polymer cover with an elastic adhesive therebetween, wherein an empty space is formed between the left surface of the polymer cover and the metal foil, and the right surface of the polymer cover is not surrounded by the metal foil, wherein on the lower surface of the elastic core, the metal foil is further extended externally from the elastic core in a longitudinal direction of the elastic core to form a terminal part in the extended area, wherein in the terminal part, the first face on which the metal coating layer is formed is an exposed surface, and the second face is configured as a contact surface for electrically connecting to an electrically conductive object, and wherein an adhesive tape is adhered to at least a portion of the second face of the metal foil.

* * * * *